US008967403B2

(12) United States Patent
Won et al.

(10) Patent No.: US 8,967,403 B2
(45) Date of Patent: Mar. 3, 2015

(54) HOIST APPARATUS AND HOIST TRANSPORTING SYSTEM

(71) Applicant: Samsung Electronics Co., Ltd., Suwon-Si, Gyeonggi-Do (KR)

(72) Inventors: Yu Dong Won, Suwon-si (KR); Seung Jun Lee, Yongin-si (KR); Jong In Lee, Seoul (KR); Min Gu Chang, Anyang-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 0 days.

(21) Appl. No.: 13/687,604

(22) Filed: Nov. 28, 2012

(65) Prior Publication Data

US 2013/0134120 A1    May 30, 2013

(30) Foreign Application Priority Data

Nov. 29, 2011 (KR) ........................ 10-2011-0126256

(51) Int. Cl.
| B66C 19/00 | (2006.01) |
| B66C 17/00 | (2006.01) |
| B66C 11/02 | (2006.01) |
| H01L 21/677 | (2006.01) |

(52) U.S. Cl.
CPC .......... *B66C 19/00* (2013.01); *H01L 21/67733* (2013.01); *H01L 21/67736* (2013.01)
USPC ........................ 212/319; 212/315; 212/322

(58) Field of Classification Search
CPC .......... B66C 17/00; B66C 7/04; B66C 13/08; B66C 17/20; B66C 7/00
USPC .................. 212/315, 319, 321–323, 74, 328
See application file for complete search history.

(56) References Cited

U.S. PATENT DOCUMENTS

| 1,035,265 | A | * | 8/1912 | Taylor | 212/331 |
| 2,659,827 | A | * | 11/1953 | Scag et al. | 250/493.1 |
| 2,964,459 | A | * | 12/1960 | Pearson | 204/279 |
| 3,006,485 | A | * | 10/1961 | Crawford | 414/542 |
| 3,247,974 | A | * | 4/1966 | Dechantsreiter | 414/591 |
| 3,458,060 | A | * | 7/1969 | Bussienne et al. | 414/281 |
| 3,604,743 | A | * | 9/1971 | Kinkopf | 294/81.21 |
| 3,747,970 | A | * | 7/1973 | Fathauer et al. | 294/81.1 |
| 3,874,514 | A | * | 4/1975 | Wilson | 212/290 |
| 4,266,904 | A | * | 5/1981 | Fadness | 414/460 |
| 4,496,063 | A | * | 1/1985 | Ishii et al. | 212/270 |
| 4,573,856 | A | * | 3/1986 | Meyer et al. | 414/561 |
| 4,668,154 | A | * | 5/1987 | Ueno et al. | 414/607 |
| 4,808,058 | A | * | 2/1989 | Carney et al. | 414/343 |
| 5,018,933 | A | * | 5/1991 | Kramer | 414/542 |
| 5,072,840 | A | * | 12/1991 | Asakawa et al. | 212/312 |

(Continued)

FOREIGN PATENT DOCUMENTS

DE    102008061197 B4 *    8/2010

*Primary Examiner* — Emmanuel M Marcelo
*Assistant Examiner* — Michael Gallion
(74) *Attorney, Agent, or Firm* — Harness, Dickey & Pierce, P.L.C.

(57) ABSTRACT

Disclosed is a hoist apparatus having an improved structure to load an object to be transported in a horizontal direction. The hoist apparatus includes a travel unit to travel along a rail, a carrier unit coupled to the travel unit so as to move in a first direction, and a cart unit coupled to the carrier unit so as to move in a second direction different from the first direction, wherein the cart unit includes a body portion, in which an object to be transferred is located, and a drive portion to drive the body portion in the second direction.

18 Claims, 11 Drawing Sheets

(56) References Cited

U.S. PATENT DOCUMENTS

| | | | |
|---|---|---|---|
| 5,133,465 A * | 7/1992 | Kalan | 212/285 |
| 5,425,464 A * | 6/1995 | Hannen et al. | 212/197 |
| 5,653,351 A * | 8/1997 | Grout et al. | 212/315 |
| 5,715,958 A * | 2/1998 | Feider et al. | 212/273 |
| 6,138,846 A * | 10/2000 | Baumann | 212/326 |
| 6,199,490 B1 * | 3/2001 | Langer | 108/143 |
| 6,379,104 B1 * | 4/2002 | Domino et al. | 414/662 |
| 6,431,379 B1 * | 8/2002 | Kroll et al. | 212/319 |
| 6,533,533 B1 * | 3/2003 | Heston | 414/791.6 |
| 7,048,491 B2 * | 5/2006 | Windbergs | 414/542 |
| 7,862,285 B1 * | 1/2011 | Dove | 414/281 |
| 8,025,474 B2 * | 9/2011 | Springston et al. | 414/809 |
| 8,206,077 B2 * | 6/2012 | Ishikawa | 414/626 |
| 8,550,267 B2 * | 10/2013 | Lee et al. | 212/319 |
| 8,635,720 B2 * | 1/2014 | Aabakken | 5/87.1 |
| 2003/0180132 A1 * | 9/2003 | Morreim | 414/458 |
| 2004/0149672 A1 * | 8/2004 | Motoori et al. | 212/332 |
| 2004/0258513 A1 * | 12/2004 | Cooke | 414/626 |
| 2006/0160684 A1 * | 7/2006 | Springston et al. | 483/1 |
| 2006/0222479 A1 * | 10/2006 | Shiwaku et al. | 414/267 |
| 2008/0128374 A1 * | 6/2008 | Kyutoku | 212/276 |
| 2008/0128376 A1 * | 6/2008 | Taniguchi | 212/322 |
| 2009/0026164 A1 * | 1/2009 | Fukaya | 212/319 |
| 2009/0255892 A1 * | 10/2009 | Collins et al. | 212/319 |
| 2011/0155683 A1 * | 6/2011 | Kim et al. | 212/307 |
| 2011/0163058 A1 * | 7/2011 | Franzen et al. | 212/319 |
| 2011/0240583 A1 * | 10/2011 | Franzen et al. | 212/318 |
| 2011/0243704 A1 * | 10/2011 | Franzen et al. | 414/792.7 |
| 2012/0175334 A1 * | 7/2012 | Chen et al. | 212/276 |

* cited by examiner

HOIST APPARATUS AND HOIST TRANSPORTING SYSTEM

CROSS-REFERENCE TO RELATED APPLICATION

This application claims priority under 35 U.S.C. §119 to Korean Patent Application No. 2011-0126256, filed on Nov. 29, 2011 in the Korean Intellectual Property Office, the entire contents of which are incorporated herein by reference.

BACKGROUND

1. Field

Embodiments of the inventive concepts relate to a hoist apparatus to transport an object to be transported while travelling along a rail and a hoist transporting system including the same.

2. Description of the Related Art

Generally, a hoist is an apparatus to lift and transfer an object to be transported. The hoist is used to convey freight at a warehouse or a rail station or to disassemble and assemble machinery at a factory. Also, the hoist may be used to transfer semiconductors.

The hoist may include a travel portion to transfer an object to be transported while traveling along a rail installed at the ceiling upon receiving drive force and a carrier to lift and transfer the object.

A carrier upwardly and downwardly movably coupled to the travel portion vertically moves upward and downward to lift an object to be transported, which is loaded in the carrier. When the object is fixed to the carrier, the travel portion may move to a port, in which the object will be loaded, along the rail. Finally, the carrier may load the object in the port. In this way, a transporting process is performed.

In the hoist with the above-stated construction, however, the object may be loaded and unloaded only in the upward and downward movement direction of the carrier, i.e. in the vertical direction. The object may not loaded in the lateral direction of the port, i.e. the horizontal direction.

SUMMARY

According to example embodiments of the inventive concepts a hoist apparatus may have an improved structure to load an object to be transported in a horizontal direction.

According to example embodiments of the inventive concepts a hoist apparatus may have an improved structure to load an object to be transported at a stable and correct position.

According to example embodiments of the inventive concepts, a hoist apparatus may include a travel unit to travel along a rail, a carrier unit coupled to the travel unit so as to move in a first direction, and a cart unit coupled to the carrier unit so as to move in a second direction different from the first direction, wherein the cart unit includes a body portion, in which an object to be transferred is located, and a drive portion to drive the body portion in the second direction.

The drive portion may include at least one drive wheel rotatably coupled to a lower part of the body portion, a first drive motor to generate power to rotate the at least one drive wheel, and a first power transmission member connected between the drive wheel and the first drive motor to transmit power generated by the first drive motor to the drive wheel.

The first power transmission member may include at least one power transmission belt.

The body portion may include a first frame coupled to the carrier unit so as to move in the second direction and a second frame, in which the object is loaded, coupled to the first frame so as to move in the first direction.

The body portion may include a second drive motor to generate power to drive the second frame and a second power transmission member connected between the second frame and the second drive motor to transmit power generated by the second drive motor to the second frame.

The hoist apparatus may further include a guide member connected between the carrier unit and the cart unit to guide movement of the cart unit so that the cart unit moves in the second direction.

The guide member may include a first guide rail fixed to the carrier unit and a second guide rail coupled to the first guide rail so as to slide in the second direction and connected between the first guide rail and the body portion.

The guide member may further include a third guide rail coupled to the second guide rail so as to slide in the second direction.

The carrier unit may include a separation preventing clamp to prevent the object loaded in the body portion from being separated from the body portion.

The carrier unit may include a position fixing portion coupled to at least one port, in which the object is loaded, to fix a position of the carrier unit relative to the port.

According to example embodiments of the inventive concepts, a hoist apparatus may include a travel unit to travel along a rail, a carrier unit coupled to the travel unit so as to move in a vertical direction, and a cart unit including a body portion to support an object to be transported, the body portion being coupled to the carrier unit so as to slide in a horizontal direction, a drive wheel to drive the body portion, and a drive motor to generate power to rotate the drive wheel.

The body portion may include a first frame coupled to the carrier unit so as to move in the horizontal direction and second frame to support the object, the second frame being coupled to the first frame so as to move in the vertical direction.

The hoist apparatus may include a fixed rail fixed to one side of the carrier unit, a first moving rail coupled to the fixed rail so as to slide in the horizontal direction, and a second moving rail coupled to the first moving rail and the first frame so as to slide in the horizontal direction.

According to example embodiments of the inventive concepts, a hoist transporting system may include at least one port, in which an object to be transported is loaded, and a hoist apparatus to load an object to be transported in the at least one port or unload the object from the at least one port, wherein the hoist apparatus includes a travel unit to travel along a rail, a carrier unit upwardly and downwardly movably coupled to the travel unit, and a cart unit including a body portion to support the object, the body portion being coupled to the carrier unit so as to slide to a front of the carrier unit and a drive portion having a power source to drive the body portion.

The drive portion may include at least one drive wheel rotatably coupled to a lower part of the body portion, a drive motor to generate power to rotate the at least one drive wheel, and a power transmission member connected between the drive wheel and the drive motor to transmit power generated by the drive motor to the drive wheel.

The at least one port may include a guide portion coupled to the carrier unit to define a movement route of the cart unit so that the cart unit moves between the carrier unit and the port.

The carrier unit may include a position fixing portion coupled to the guide portion to fix a position of the carrier unit relative to the port.

The guide portion may include a guide pin protruding upward from one side thereof, and the position fixing portion may include a receiving hole to receive the guide pin.

According to example embodiments of the inventive concepts, a hoist apparatus may include a travel unit configured to travel along a rail; a carrier unit movably coupled to the travel unit; and a cart unit movably coupled to the carrier unit, the cart unit including a body portion configured to hold an object to be transferred, the cart unit being configured to extend the body portion laterally outward from the carrier unit and to retract the extended body portion laterally into the carrier unit.

The cart unit may further include a motor configured to drive the extension and contraction of the body unit.

BRIEF DESCRIPTION OF THE DRAWINGS

The above and other features and advantages of example embodiments will become more apparent by describing in detail example embodiments with reference to the attached drawings. The accompanying drawings are intended to depict example embodiments and should not be interpreted to limit the intended scope of the claims. The accompanying drawings are not to be considered as drawn to scale unless explicitly noted.

DETAILED DESCRIPTION

Detailed example embodiments are disclosed herein. However, specific structural and functional details disclosed herein are merely representative for purposes of describing example embodiments. Example embodiments may, however, be embodied in many alternate forms and should not be construed as limited to only the embodiments set forth herein.

Accordingly, while example embodiments are capable of various modifications and alternative forms, embodiments thereof are shown by way of example in the drawings and will herein be described in detail. It should be understood, however, that there is no intent to limit example embodiments to the particular forms disclosed, but to the contrary, example embodiments are to cover all modifications, equivalents, and alternatives falling within the scope of example embodiments. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

The terminology used herein is for the purpose of describing particular embodiments only and is not intended to be limiting of example embodiments. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Figure 1:
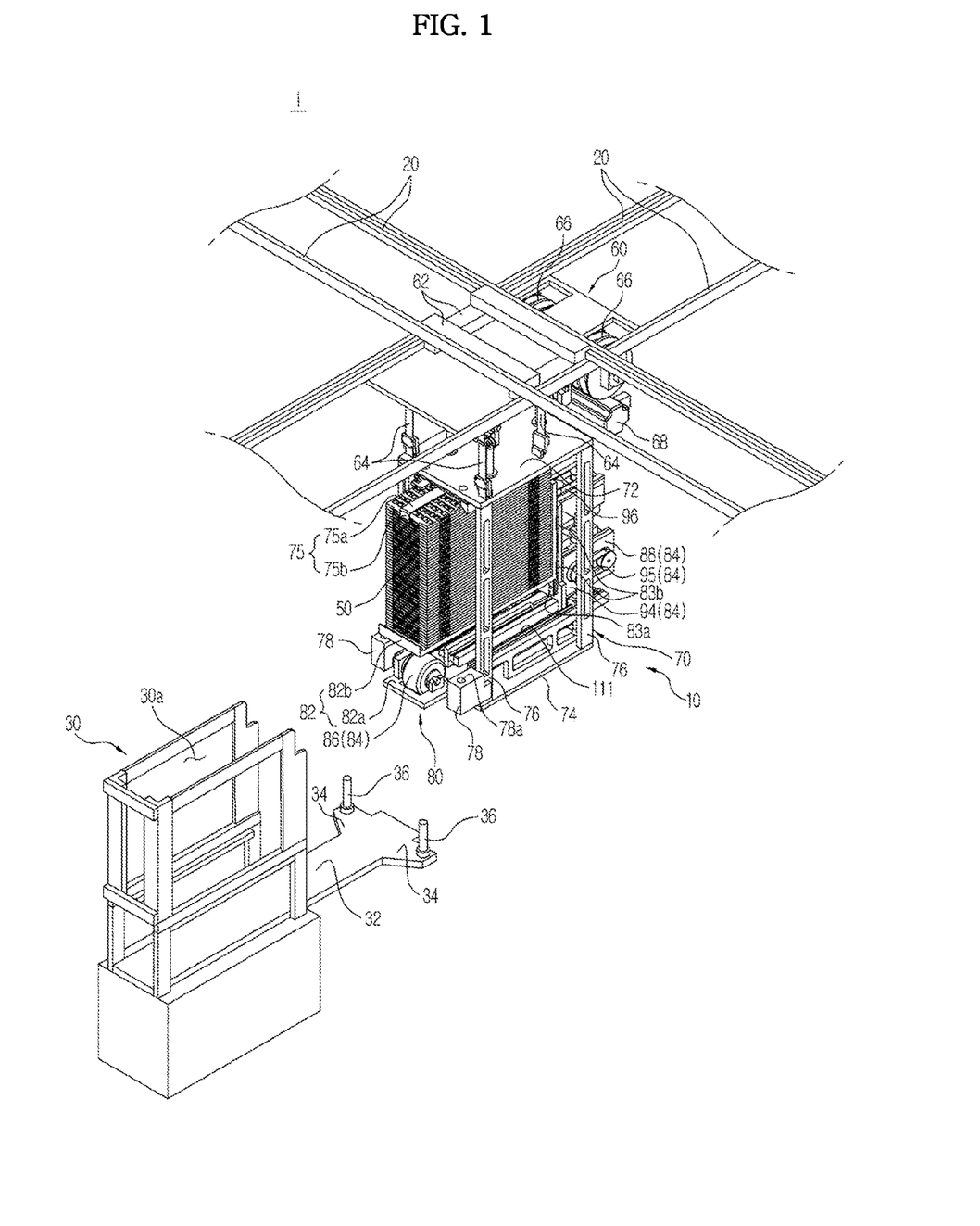
FIG. 1 is a perspective view showing a hoist transporting system according to example embodiments of the inventive concepts.

FIG. 1 is a perspective view showing a hoist transporting system 1 according to example embodiments of the inventive concepts.

As shown in FIG. 1, the hoist transporting system 1 may include rails, on which a hoist apparatus 10 travels, at least one port 30, on which an object 50 to be transported is loaded, and a hoist apparatus 10 to load, transfer, and unload the object 50.

The rails 20 may be provided at the ceiling of a work space, in which the hoist transporting system 1 is installed, or a portion adjacent to the ceiling so that the rails 20 are perpendicular to each other.

The port 30 may be configured to temporarily load the object 50. A receiving portion 30a, in which the object 50 is loaded, may be defined in the port 30.

Also, the port 30 may include a guide portion 32 coupled to a carrier unit 70 of the hoist apparatus 10 during loading of the object 50 in the port 50 or during unloading of the object 50 from the port 30 to define a movement route of a cart unit 80 so that the cart unit 80 moves between the port 30 and the carrier unit 70.

The guide portion 32 may be provided at one end of the port 30 with enlarged width portions 34 extending to opposite sides of the guide portion 32. At each enlarged width portion 34 a guide pin 36 may be provided protruding upward from the top of each enlarged width portion 34 by a predetermined length. The guide pin 36 may be coupled to a position fixing portion 78 of the carrier unit 70 to fix the position of the carrier unit 70 relative to the port 30 during loading of the object 50 in the port 30 or during unloading of the object 50 from the port 30 so that the cart unit 80 loads the object 50 at a stable and correct position.

The hoist apparatus 10 may be configured to load, transfer, and unload the object 50 while traveling along the rails 20. Hereinafter, the hoist apparatus 10 will be described in detail.

Figure 2:
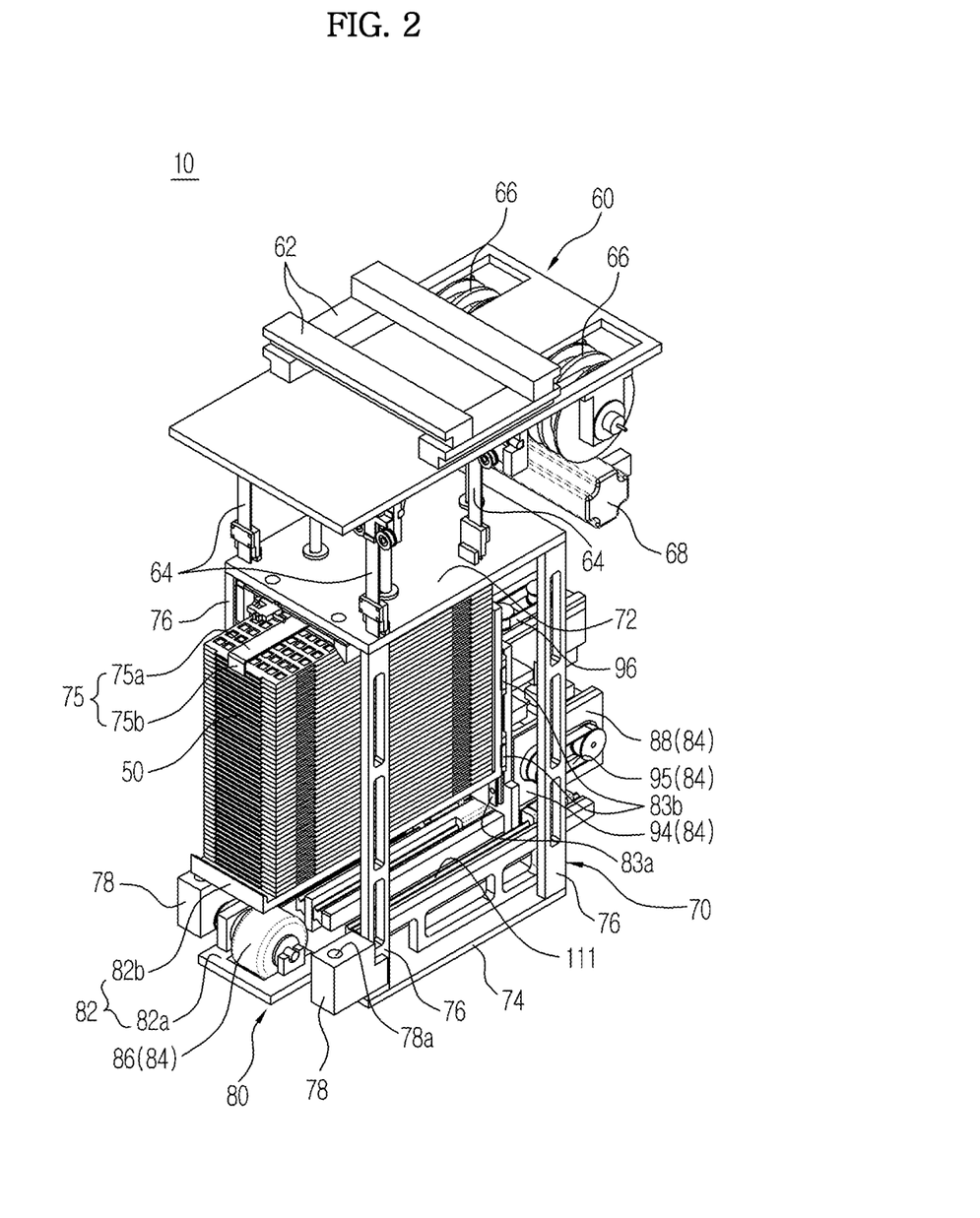
FIG. 2 is a perspective view of a hoist apparatus shown in FIG. 1 showing that a cart unit is disposed at a first position.
Figure 3:
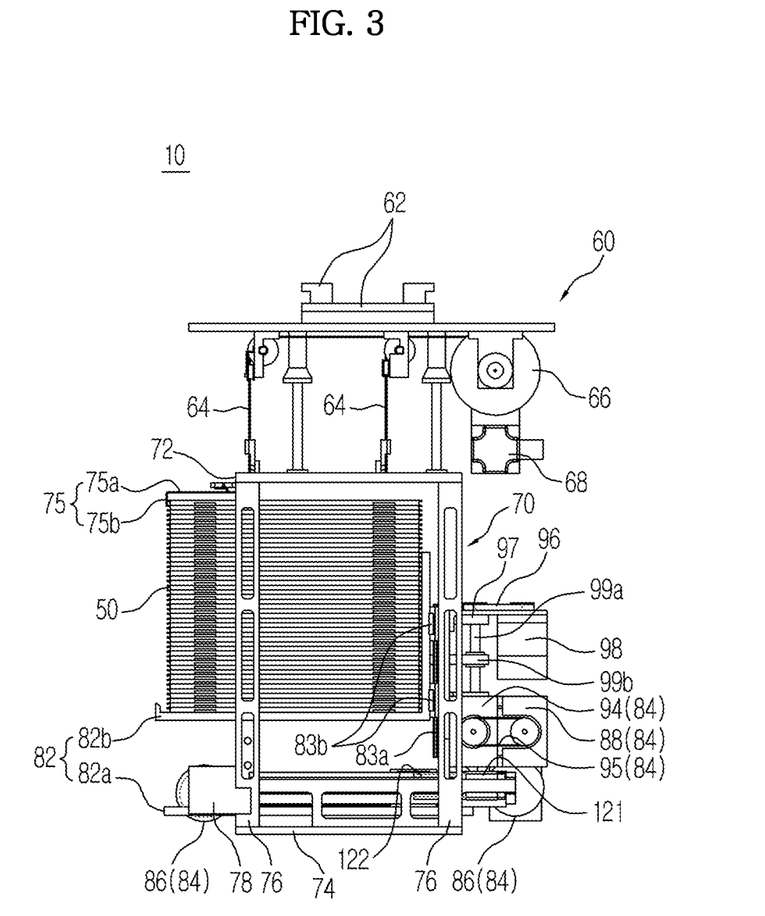
FIG. 3 is a side view of FIG. 2.
Figure 4:
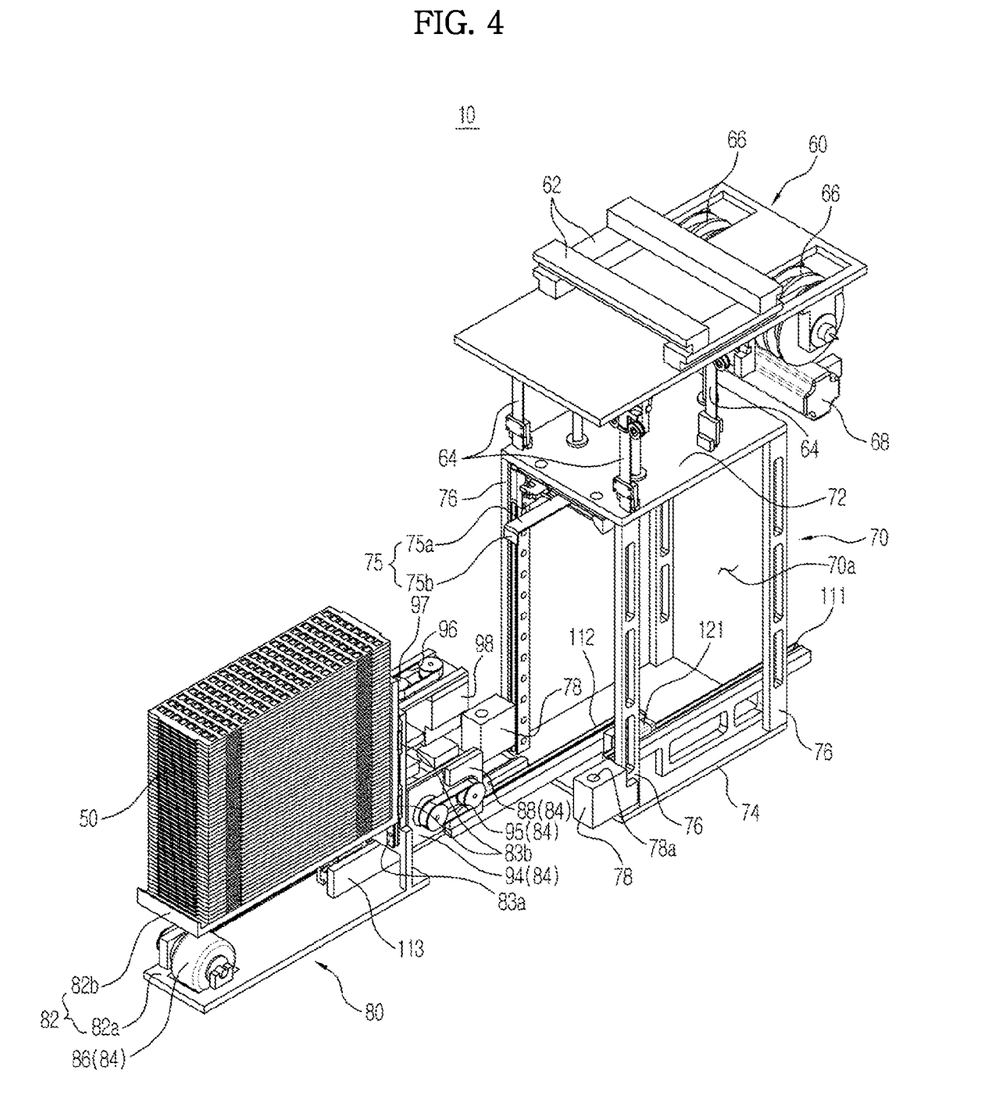
FIG. 4 is a perspective view showing that the cart unit is disposed at a second position.
Figure 5:
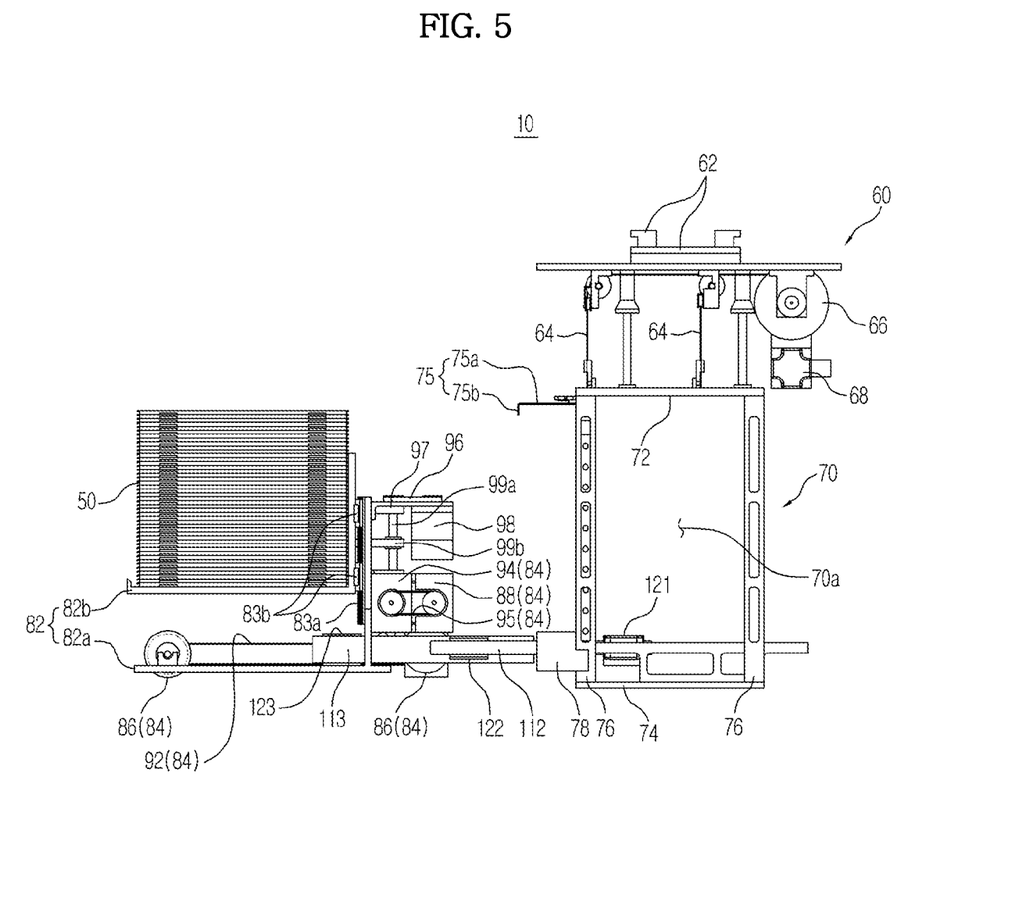
FIG. 5 is a side view of FIG. 4.
Figure 6:
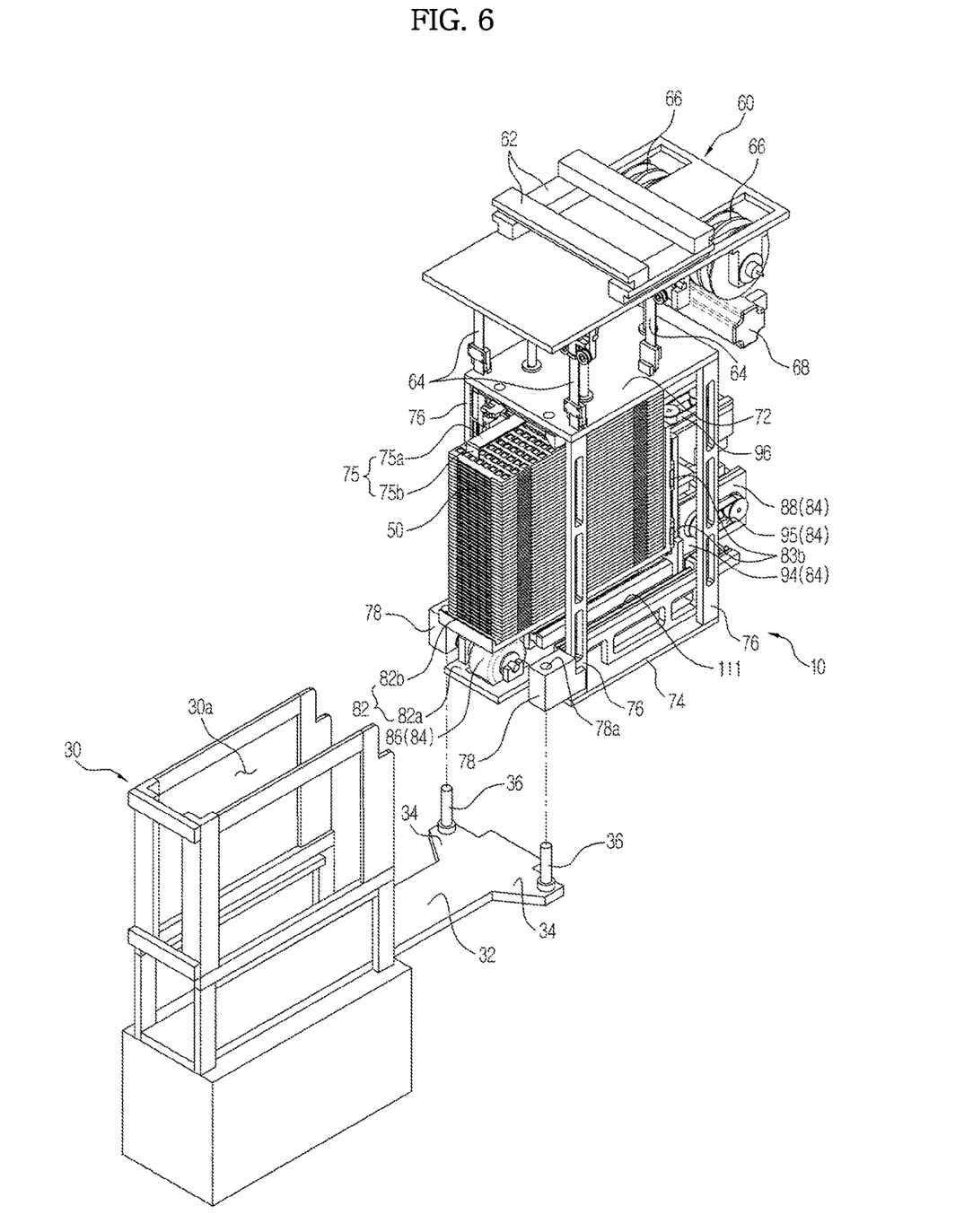
FIG. 6 is a perspective view showing the coupling between the hoist apparatus and a port.

FIG. 2 is a perspective view of the hoist apparatus shown in FIG. 1 showing that the cart unit is disposed at a first position, FIG. 3 is a side view of FIG. 2, FIG. 4 is a perspective view showing that the cart unit is disposed at a second position, FIG. 5 is a side view of FIG. 4, and FIG. 6 is a perspective view showing the coupling between the hoist apparatus and the port.

As shown in FIGS. 2 to 6, the hoist apparatus 10 may include a travel unit 60 to travel along the rails 20, a carrier unit 70 coupled to the travel unit 60 so that the carrier unit 70 moves in a direction perpendicular to the ground, i.e. a first direction, and a cart unit 80 coupled to the carrier unit 70 so that the cart unit moves in a direction parallel to the ground, i.e. a second direction.

The travel unit 60 may include a rail connection portion 62 connected to the rails 20 to travel along the rails 20, a plurality of belts 64 connected to the carrier unit 70 to support the carrier unit 70, a plurality of pulleys 66 on which the belts 64 are wound or unwound, and a motor 68 connected to the pulleys 66 to rotate the pulleys 66. The rotation direction of the pulleys 66 may be controlled according to the forward or reverse rotation direction of the motor 68, and the belts are wound or unwound according to the rotation direction of the pulleys 66. As a result, the carrier unit 70 may be moved upward or downward. A decelerator (not show) to effectively support a load applied to the carrier unit 70 may be mounted to the motor 68.

As is illustrated in FIG. 4, the carrier unit 70 may include a cart unit receiving portion 70a to receive the cart unit 80, an upper frame 72, lower frame 74, and side frames 76 to define the cart unit receiving portion 70a, and a separation preventing clamp 75 coupled to at least one of the side frames 76 so that the separation preventing clamp 75 moves in the first direction to prevent the object 50 loaded in the cart unit 80 from being separated from the cart unit 80.

The upper frame 72 may be coupled to the belts 64. The side frames 76 may be connected between the upper frame 72 and the lower frame 74. Position fixing portions 78 may be coupled to the guide portion 32 to fix the position of the carrier unit 70 relative to the port 30 are provided at one side of the lower frame 74 facing the front of the carrier unit 70.

As shown in FIG. 6, the position fixing portions 78 may be provided with receiving holes 78a, each of which may have a diameter corresponding to the outer diameter of each of the guide pins 36, so that the guide pins 36 are inserted into the receiving holes 78a. The receiving holes 78a may be coupled to the respective guide pins 36 to fix the position of the carrier unit 70 relative to the port 30 during loading of the object 50 in the port 50 or during unloading of the object 50 from the port 30.

The separation preventing clamp 75 may be coupled to at least one of the side frames 76 so as to move in the first direction so that the position of the separation preventing clamp 75 is changed according to the height of the object 50 loaded in the cart unit 80. The separation preventing clamp 75 may include a first plate 75a extending to the front of the carrier unit 70 by a predetermined length so as to contact the top of the object 50 loaded in the cart unit 80 or to be spaced apart from the top of the object 50 by a predetermined distance and a second plate 75b bent at one end of the first plate 75a so as to contact one side of the object 50 loaded in the cart unit 80 or to be spaced apart from one side of the object 50 by a predetermined distance. The first plate 75a and the second plate 75b may contact the top and one side of the object 50 or be spaced apart from the top and one side of the object 50 by the predetermined, or alternatively, reference distance to prevent the object 50 from being separated from the cart unit 80 during the carrier unit 70 transferring the object 50.

The cart unit 80 may include a body portion 82, in which the object 50 is located and supported, and a drive portion 74 to drive the body portion 82 in the second direction.

The drive portion 84 may include at least one drive wheel 86 rotatably coupled to the lower part of the body portion 82, a first drive motor 88 to generate power to rotate the drive wheel 86, and a first power transmission member 92 connected between the drive wheel 86 and the first drive motor 88 to transmit power generated by the first drive motor 88 to the drive wheel 86. The first power transmission member 92 may be implemented by, for example, a power transmission belt.

Between the first drive motor 88 and the first power transmission member 92 may be provided a first connection pulley 94 to transmit power generated by the first drive motor 88 to the drive wheel 86 via the first power transmission member 92. The first connection pulley 94 may be connected to the first drive motor 88 via a first connection belt 95 and to drive wheel 86 via the first power transmission member 92.

The power generated by the first drive motor 88 may be transmitted to the first connection pulley 94 via the first connection belt 95 to rotate the first connection pulley 94, and rotational force of the first connection pulley 94 may be transmitted to the drive wheel 86 via the first power transmission member 92. As a result, the body portion 82 may be driven in the second direction.

The body portion 82 may include a first frame 82a coupled to the carrier unit 70 so as to move in the second direction, a second frame 82b, in which the object 50 is loaded, coupled to the first frame 82a so as to move in the first direction, a second drive motor 98 to generate power to drive the second frame 82b, and a second power transmission member 96 connected between the second frame 82b and the second drive motor 98 to transmit power generated by the second drive motor 98 to the second frame 82b. The second power transmission member 96 may be implemented by, for example, by a power transmission belt.

The second frame 82b may be coupled to the first frame 82a via at least one first guide rail 83a and at least one first guide block 83b slidably coupled to the first guide rail 83a so that the second frame 82b moves in the first direction.

The second drive motor 98 and a second connection pulley 97, which may be connected to the second drive motor 98 via the second power transmission member 96, may be provided at the rear of the second frame 82b. A ball nut member 99b, coupled with a ball screw member 99a rotated equally with the second connection pulley 97 to linearly move in the first direction according to the rotation of the ball screw member 99a, may be coupled to the back side of the second frame 82b.

The power generated by the second drive motor 98 may be transmitted to the second connection pulley 97 via the second power transmission member 96 to rotate the second connection pulley 97, and rotational force of the second connection pulley 97 may be transmitted to the ball nut member 99b via the ball screw member 99a. As a result, the second frame 82b may be driven in the first direction.

In this way, the cart unit 80 may load the object 50 in the port 30 or unload the object 50 from the port 30 in a self-driven fashion.

The cart unit 80 may be connected to the carrier unit 70 via a guide member 110.

The guide member 110 may be configured to move the cart unit 80 so that the guide 32 is not separated during movement of the cart unit 80 in the second direction. The guide member 110 may be configured to have a three-stage slide structure including a first guide rail 111 fixed to the carrier unit 70, a second guide rail 112 coupled to the first guide rail 111 so as to slide in the second direction, and a third guide rail 113 coupled to the second guide rail 112 so as to slide in the second direction and connected between the second guide rail 112 and the first frame 82a. The second guide rail 112 may be slidably coupled to the first guide rail 111 via a first guide block 121, the third guide rail 113 may be slidably coupled to the second guide rail 112 via a second guide block 122, and the first frame 82a may be slidably coupled to the third guide rail 113 via a third guide block 123.

Meanwhile, the first guide rail 111 may be fixed to the carrier unit 70, and therefore, the first guide rail 111 may be regarded as a fixed rail. On the other hand, the second guide rail 112 and the third guide rail 113 may slide, and therefore, the second guide rail 112 and the third guide rail 113 may be regarded as moving rails.

As shown in FIGS. 2 and 3, the first guide rail 111, the second guide rail 112, and the third guide rail 113 may be disposed in the carrier unit 70 in parallel in a state in which the cart unit 80 is disposed at a first position at which the cart unit 80 is completely received inside the cart unit receiving portion 70a of the carrier unit 70. As shown in FIGS. 4 and 5, the first guide rail 111, the second guide rail 112, and the third guide rail 113 may be disposed outside the carrier unit 70 in a line in a state in which the cart unit 80 is disposed at a second position at which the cart unit 80 is completely moved to the front of the carrier unit 70.

The number of guide rails constituting the guide member 110 may be changed depending upon the moving stroke of the cart unit 80. For example, in a case in which the distance to load the object 50 in the port 30 is long, the moving stroke of the cart unit 80 may be increased with the result that the number of the guide rails is increased. On the other hand, in a case in which the distance to load the object 50 in the port 30 is short, the moving stroke of the cart unit 80 is decreased with the result that the number of the guide rails is decreased. According to example embodiments of the inventive concepts, the length of the guide rails may be increased or decreased without changing the number of the guide rails.

Hereinafter, a process of a process of loading the object 50 using the hoist apparatus 10 according to example embodiments of the inventive concepts will be described.

FIGS. 7A to 7E are views showing a process of the hoist apparatus loading an object to be transported on the port.

Figure 7A:
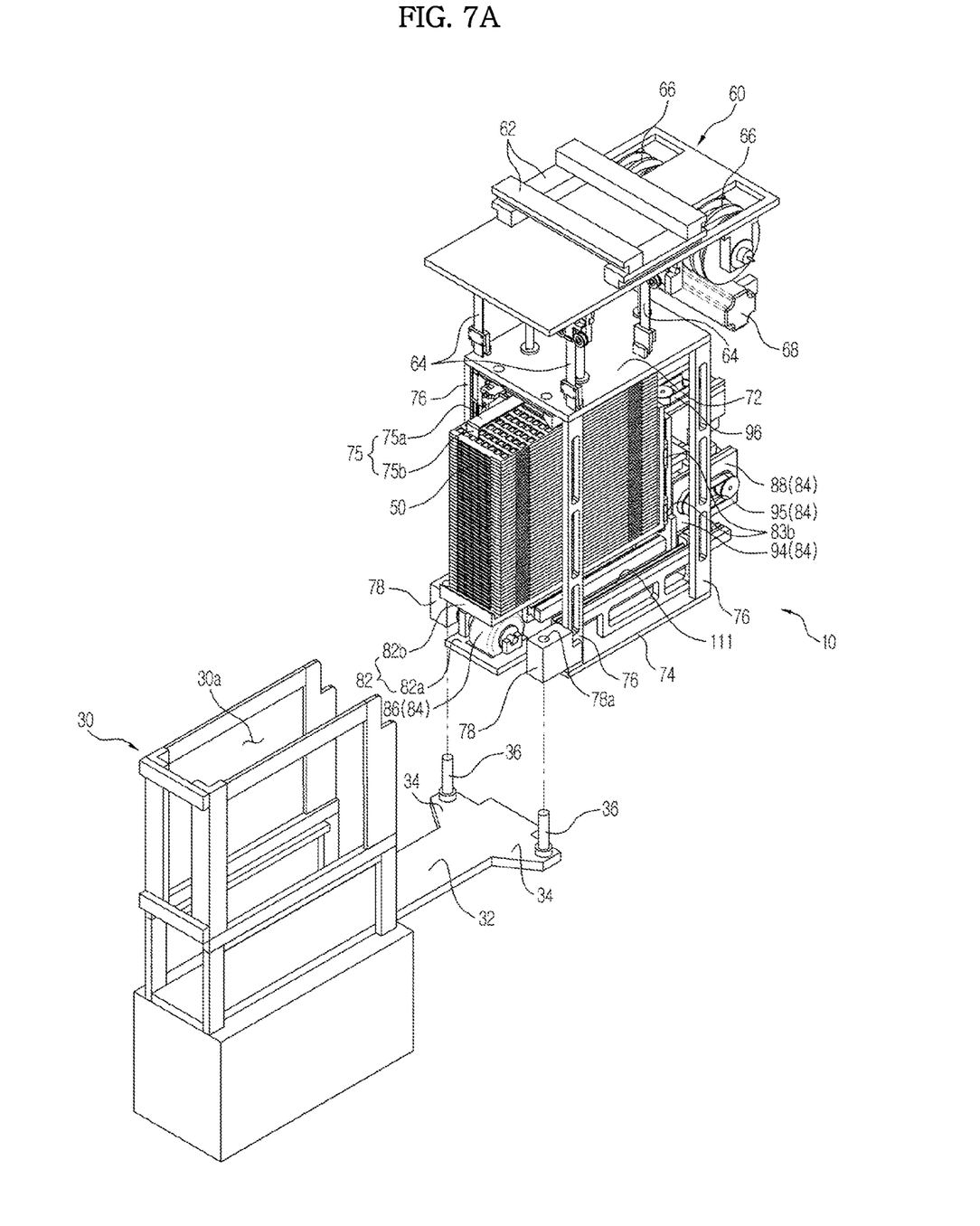
FIGS. 7A to 7E are views showing a process of the hoist apparatus loading an object to be transported on the port.

As shown in FIG. 7A, the travel unit 60 of the hoist apparatus 10 may move along the rails 20 so that the hoist apparatus 10 is disposed at a position at which the center of each receiving hole 78a provided at the position fixing portion 78 of the carrier unit 70 and the center of each guide pin 36 are aligned to each other.

Figure 7B:
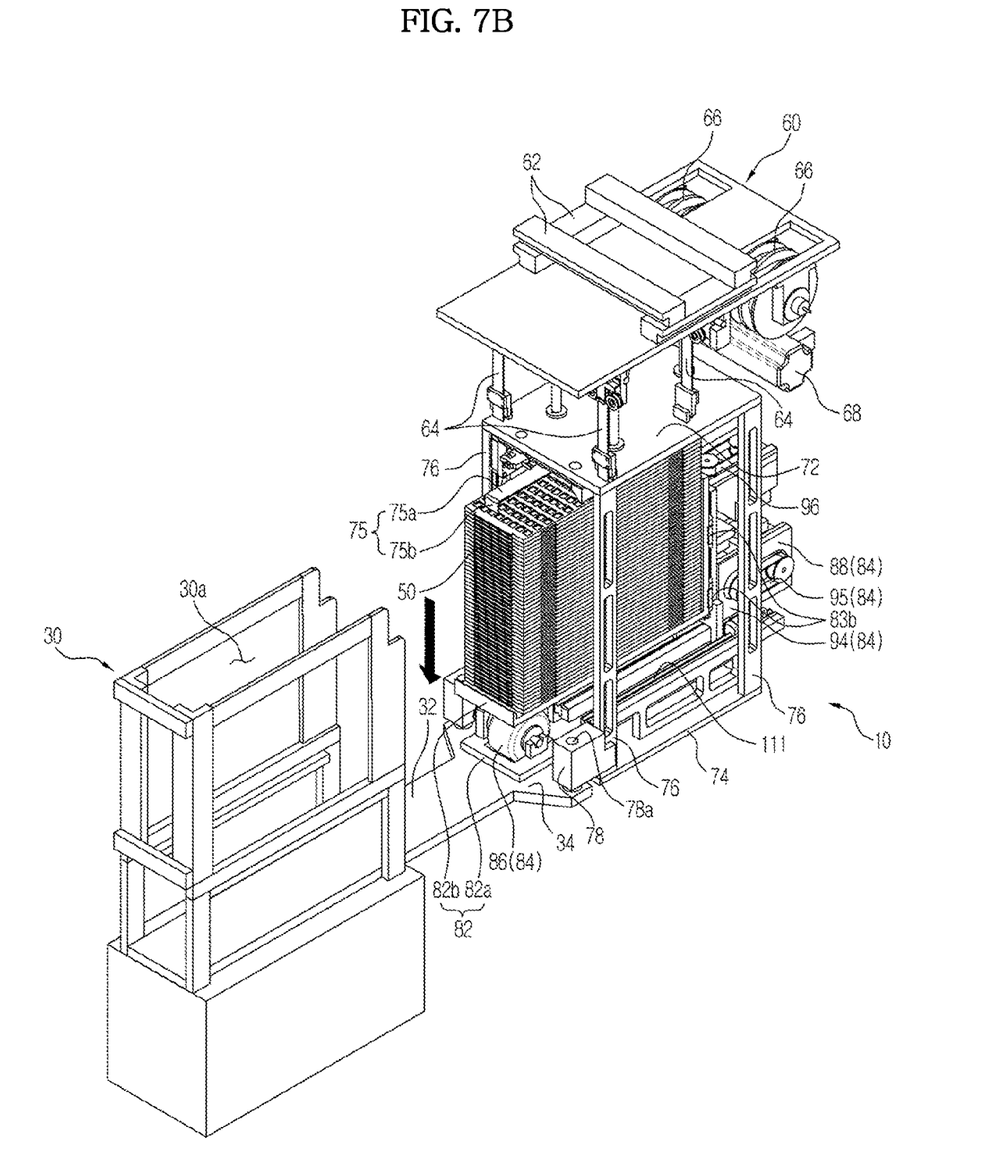

When the hoist apparatus 10 is disposed at the position at which the center of each receiving hole 78a and the center of each guide pin 36 are aligned to each other, as shown in FIG. 7B, the carrier unit 70 may move downward in the first direction so that each receiving hole 78a and each guide pin 36 are coupled to each other. Upon completion of coupling between each receiving hole 78a and each guide pin 36, the position of the carrier unit relative to the port 30 may be fixed, and the port 30 and the carrier unit 70 may be connected to each other via the guide portion 32 to form a movement route, along which the cart unit 80 moves.

Figure 7C:
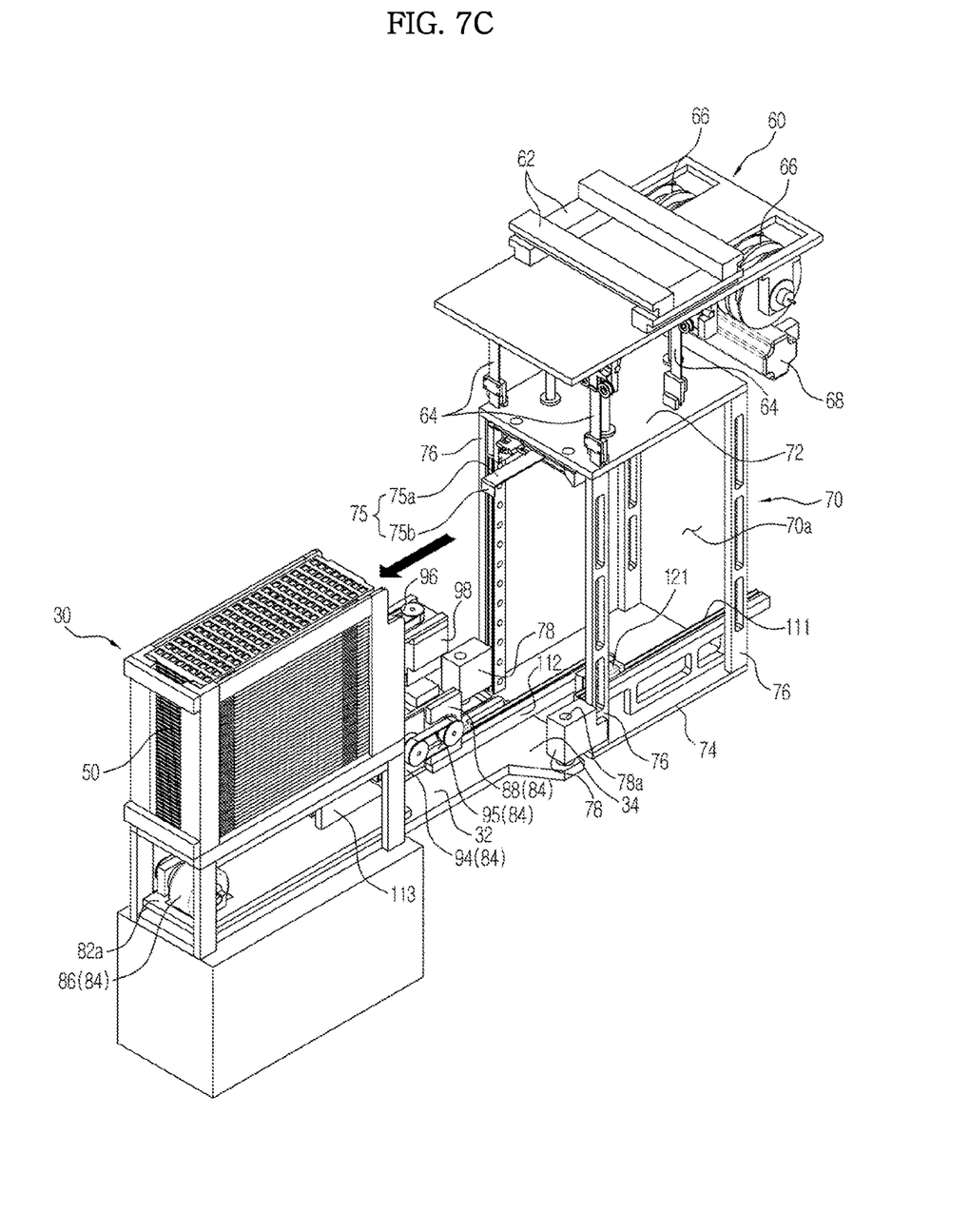

When the port 30 and the carrier unit 70 are connected to each other to form the movement route, along which the cart unit 80 moves, as shown in FIG. 7C, the drive portion 84 may be driven, and the body portion 82 of the cart unit 80 may move to the front of the carrier unit 70, i.e. in the second direction, and enters the port 30.

Figure 7D:
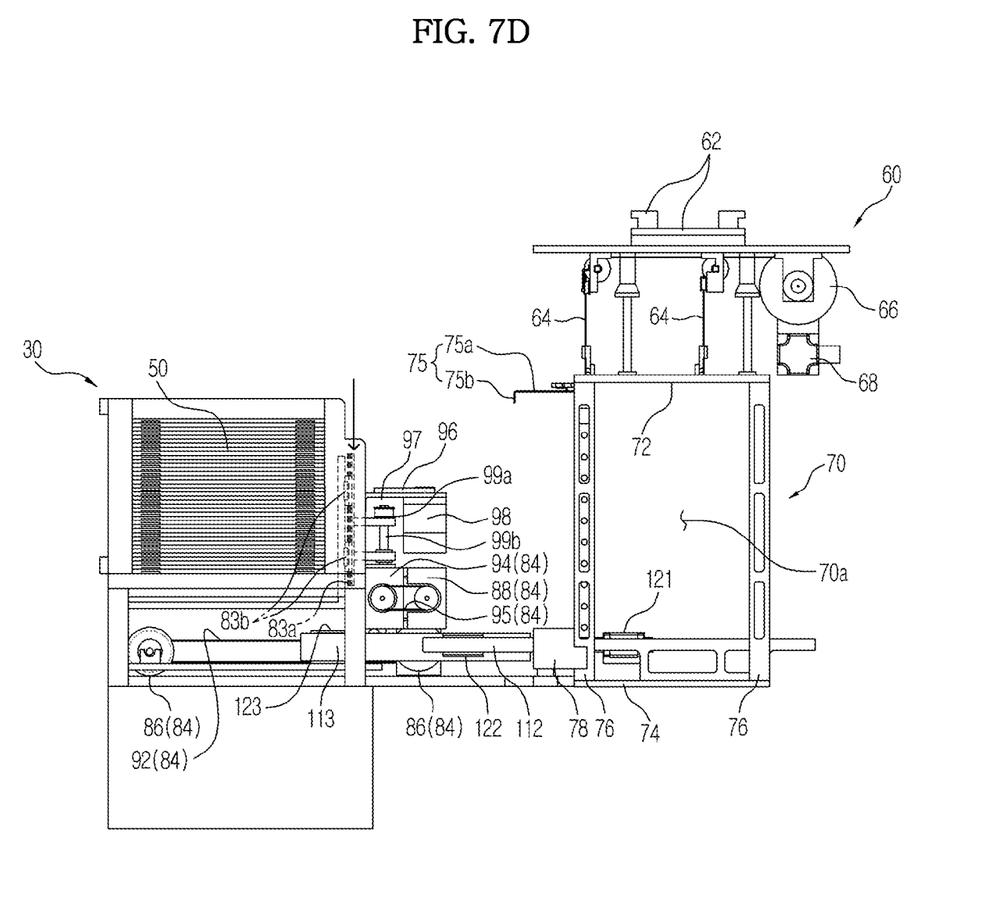

When the cart unit 80 completely enters the port 30, as shown in FIG. 7D, the second drive motor 98 may be driven, power generated by the second drive motor 98 may be transmitted to the second connection pulley 97 via the second power transmission member 96 to rotate the second connection pulley 97, rotational force of the second connection pulley 97 may be transmitted to the ball nut member 99b via the ball screw member 99a, and the second frame 82b coupled to the ball nut member 99b may move vertically in the first direction. The object 50, located in the second frame 82b, may be separated from the second frame 82b and loaded in the port 30 during vertically downward movement of the object 50 together with the second frame 82b.

Figure 7E:
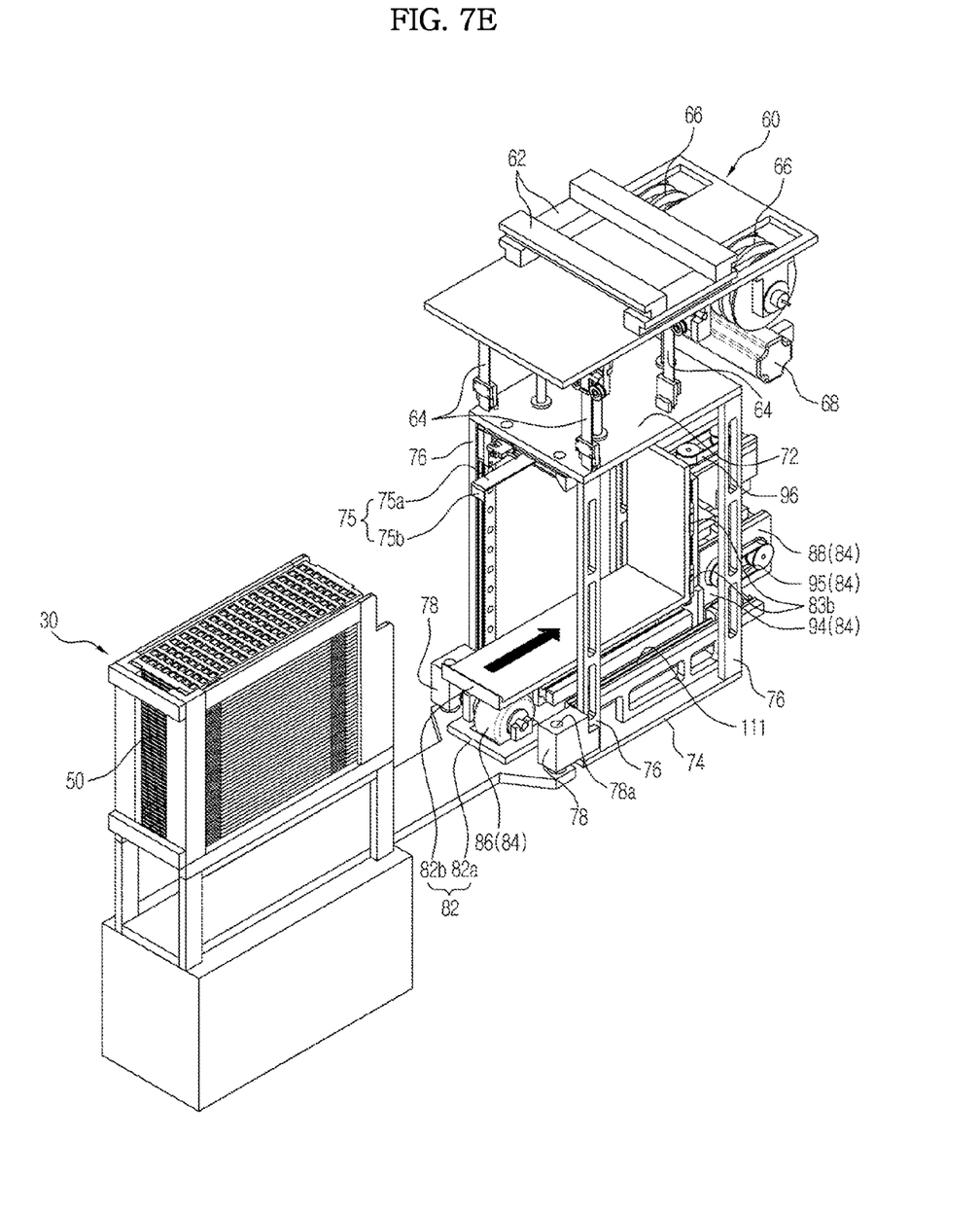

When loading of the object 50 is completed, as shown in FIG. 7E, the cart unit 80 may retreat from the port 30 and move into the carrier unit 70, and the hoist apparatus 10 may moves to a position to transfer another object or return to the original position thereof.

As is apparent from the above description, according to example embodiments of the inventive concepts, the cart unit connected to the carrier unit so as to move in the horizontal direction my directly enter the port, and therefore, the object may be loaded in the horizontal direction.

Also, the position of the carrier unit relative to the port during loading of the object is fixed, and therefore, the object is loaded at a stable and correct position.

Example embodiments having thus been described, it will be obvious that the same may be varied in many ways. Such variations are not to be regarded as a departure from the intended spirit and scope of example embodiments, and all such modifications as would be obvious to one skilled in the art are intended to be included within the scope of the following claims.

What is claimed is:
1. A hoist apparatus comprising:
a travel unit to travel along an upper rail;
a carrier unit movably coupled to the travel unit such that the carrier unit is configured to move in a first direction relative to the travel unit, the first direction being one of a vertical direction away from the travel unit and a vertical direction towards the travel unit; and
a cart unit movably coupled to the carrier unit, wherein the cart unit includes
 a body portion configured to hold an object to be transferred, the body portion being movably coupled to the carrier such that the body portion is configured to move in a second direction relative to the carrier unit, the first direction being perpendicular to the second direction; and
 a drive portion,
 wherein the drive portion further includes,
  at least one drive wheel rotatably coupled to a lower part of the body portion,
  a first drive motor configured to generate power to rotate the at least one drive wheel, and
  a first power transmission member connected between the drive wheel and the first drive motor, the first transmission member being configured to transmit power generated by the first drive motor to the drive wheel,
  the drive portion being configured to drive the body portion outward from the carrier unit in the second direction by rotating the at least one drive wheel such that the at least one drive wheel rolls along a first surface in the second direction.

2. The hoist apparatus according to claim 1, wherein
the carrier unit is coupled to the travel unit such that the carrier unit is configured to be lowered vertically away from the travel unit and raised vertically towards the travel unit, and
the cart unit is coupled to the carrier unit such that the cart unit is configured extend the body portion horizontally outwards from the carrier unit and retract the body portion horizontally into the carrier unit,
the second direction being a horizontal direction.

3. The hoist apparatus according to claim 1,
wherein the first power transmission member includes at least one power transmission belt.

4. The hoist apparatus according to claim 3, wherein the body portion includes,
   a first frame coupled to the carrier unit so as to move in the second direction; and
   a second frame that is configured to hold the object, and coupled to the first frame so as to move in the first direction.

5. The hoist apparatus according to claim 4, wherein the body portion comprises:
   a second drive motor configured to generate power to drive the second frame; and
   a second power transmission member connected between the second frame and the second drive motor, the second power transmission member being configured to transmit power generated by the second drive motor to the second frame.

6. The hoist apparatus according to claim 4, further comprising:
   a guide member connected between the carrier unit and the cart unit, the guide member being configured to guide movement of the cart unit so that the cart unit moves in the second direction.

7. The hoist apparatus according to claim 6, wherein the guide member comprises:
   a first guide rail fixed to the carrier unit; and
   a second guide rail that is coupled to the first guide rail such that that second guide rail is capable of sliding in the second direction, and connected between the first guide rail and the body portion.

8. The hoist apparatus according to claim 7, wherein the guide member further comprises:
   a, third guide rail coupled to the second guide rail such that the third guide rail is capable of sliding in the second direction.

9. The hoist apparatus according to claim 1, wherein the carrier unit comprises:
   a separation preventing clamp configured to prevent the object loaded in the body portion from being separated from the body portion.

10. The hoist apparatus according to claim 1, wherein the carrier unit comprises:
   a position fixing portion coupled to at least one port, the port being configured to receive the object, the position fixing portion being configured to fix a position of the carrier unit relative to the port.

11. A hoist transporting system comprising:
   at least one port configured to receive an object to be transported; and
   a hoist apparatus configured to load the object to be transported in the at least one port or unload the object from the at least one port, wherein the hoist apparatus includes,
     a travel unit to travel along an upper rail;
     a carrier unit movably coupled to the travel unit such that the carrier unit is configured to move in a first direction relative to the travel unit, the first direction being one of a vertical direction away from the travel unit and a vertical direction towards the travel unit; and
     a cart unit movably coupled to the carrier unit,
   wherein the cart unit includes,
     a body portion configured to hold an object to be transferred, the body portion being movably coupled to the carrier such that the body portion is configured to move in a second direction relative to the carrier unit, the first direction being perpendicular to the second direction; and
     a drive portion,
   wherein the drive portion further includes,
     at least one drive wheel rotatable coupled to a lower part of the body portion,
     a first drive motor configured to generate power to rotate the at least one drive wheel, and
     a first power transmission member connected between the drive wheel and the first drive motor, the first transmission member being configured to transmit power generated by the first drive motor to the drive wheel,
     the drive portion being configured to drive the body portion outward from the carrier unit in the second direction by rotating the at least one drive wheel such that the at least one drive wheel rolls along a first surface in the second direction.

12. The hoist transporting system according to claim 11, wherein
the power transmission member is configured to transmit power generated by the drive motor to the drive wheel.

13. The hoist transporting system according to claim 12, wherein the at least one port comprises:
   a guide portion coupled to the carrier unit, the guide portion being configured to define a movement route of the cart unit so that the cart unit moves between the carrier unit and the port.

14. The hoist transporting system according to claim 13, wherein the carrier unit comprises:
   a position fixing portion coupled to the guide portion, the position fixing portion being configured to fix a position of the carrier unit relative to the port.

15. The hoist transporting system according to claim 14, wherein
the guide portion includes a guide pin protruding upward from one side thereof, and the position fixing portion includes a receiving hole configured to receive the guide pin.

16. A hoist apparatus comprising:
a travel unit configured to travel along a rail;
a carrier unit movably coupled to the travel unit such that the carrier unit is configured to move in a first direction relative to the travel unit; and
a cart unit movably coupled to the carrier unit,
the cart unit including,
   a body portion configured to hold an object to be transferred, the cart unit being configured to extend the body portion laterally outward from the carrier unit in a second direction and to retract the extended body portion laterally into the carrier unit, the second direction being perpendicular to the first direction, and a drive portion,
wherein the drive portion further includes,
- at least one drive wheel rotatably coupled to a lower part of the body portion,
- a first drive motor configured to generate power to rotate the at least one drive wheel in at least a first direction, and
- a first power transmission member connected between the drive wheel and the first drive motor, the first transmission member being configured to transmit power generated by the first drive motor to the drive wheel,
- the drive portion being configured to drive the body portion outward from the carrier unit by rotating the at least one drive wheel such that the at least one drive wheel rolls along a first surface in the second direction.

17. The hoist apparatus of claim 16, wherein the cart unit further includes a motor configured to drive the extension and contraction of the body unit.

18. The hoist apparatus of claim 16, wherein the carrier unit is coupled to the travel unit such that the carrier unit is configured to move vertically upwards towards the travel unit and downwards away from the travel unit, the vertical movement of the carrier unit relative to the travel unit being perpendicular to the lateral movement of the body portion relative to the carrier unit.

* * * * *